(12) United States Patent
Gershkovich et al.

(10) Patent No.: US 11,357,129 B2
(45) Date of Patent: Jun. 7, 2022

(54) MOUNTING SYSTEM WITH COOLANT CONNECTION HAVING A SELF-SEALING IN-LINE VALVE AND COMPONENTS AND METHODS THEREOF

(71) Applicant: Lockheed Martin Corporation, Bethesda, MD (US)

(72) Inventors: Ilya Gershkovich, Philadelphia, PA (US); Marc T. Angelucci, Cherry Hill, NJ (US); Robert R. Pearson, Avon, CT (US); Anthony J. Bednarz, Moorestown, NJ (US)

(73) Assignee: Lockheed Martin Corporation, Bethesda, MD (US)

( * ) Notice: Subject to any disclaimer, the term of this patent is extended or adjusted under 35 U.S.C. 154(b) by 0 days.

(21) Appl. No.: 16/688,874

(22) Filed: Nov. 19, 2019

(65) Prior Publication Data

US 2021/0153384 A1    May 20, 2021

(51) Int. Cl.
*H05K 7/20* (2006.01)
*H05K 7/14* (2006.01)

(52) U.S. Cl.
CPC .......... *H05K 7/20272* (2013.01); *H05K 7/14* (2013.01)

(58) Field of Classification Search
CPC ........ H05K 7/14; H05K 7/20272; F16L 29/04
See application file for complete search history.

(56) References Cited

U.S. PATENT DOCUMENTS

| | | | |
|---|---|---|---|
| 2,735,696 A | | 2/1956 | Omon et al. |
| 3,500,859 A | | 3/1970 | Pearson |
| 3,967,838 A | * | 7/1976 | Legris ................... F16L 27/093 285/190 |
| 4,200,121 A | | 4/1980 | Walter et al. |

(Continued)

FOREIGN PATENT DOCUMENTS

DE          26 51 015 B1      5/1978

OTHER PUBLICATIONS

"M5 Thread, Hex Head," M5S-100—Beswick Engineering (2 pgs.) (last accessed Nov. 19, 2019).

(Continued)

*Primary Examiner* — Mukundbhai G Patel
(74) *Attorney, Agent, or Firm* — Michael Best & Friedrich LLP

(57) ABSTRACT

A mounting system for functionally-coupling a line-replaceable unit with a structural manifold for supplying fluid coolant can comprise a fastener for the line-replaceable unit having a base and a projection. The projection can have a proximal portion and a distal portion, where the fastener is at least partially-threaded along the projection, and a plurality of seals are disposed radially along the projection. A channel can extend along a longitudinal axis of the fastener from the distal portion of the projection toward the proximal portion of the projection. One or more outlets can be disposed along the projection, the one or more outlets providing fluid communication between the channel and an external environment of the fastener. The fastener can be reversibly-coupled to a mating fastener of the structural (Continued)

manifold such that, when coupled, the line-replaceable unit is rigidly coupled to the structural manifold and fluid is able to flow therebetween.

18 Claims, 14 Drawing Sheets

(56) References Cited

U.S. PATENT DOCUMENTS

| | | | | |
|---|---|---|---|---|
| 4,765,657 | A * | 8/1988 | Cruse | F16L 37/23 |
| | | | | 251/149.9 |
| 5,255,699 | A | 10/1993 | Herzan et al. | |
| 6,729,608 | B1 | 5/2004 | Del Sole | |
| 7,147,205 | B1 | 12/2006 | Fischer et al. | |
| 8,817,473 | B2 * | 8/2014 | Babish | H05K 7/20781 |
| | | | | 361/699 |
| 10,188,016 | B2 * | 1/2019 | Lunsman | H05K 7/20772 |
| 2006/0151032 | A1 | 7/2006 | Giagnoli et al. | |
| 2016/0356558 | A1 | 12/2016 | Franz et al. | |
| 2017/0254459 | A1 | 9/2017 | Chen | |

OTHER PUBLICATIONS

International Search Report with Written Opinion for related Application No. PCT/US2020/059413 dated Mar. 21, 2021 (13 Pages).

* cited by examiner

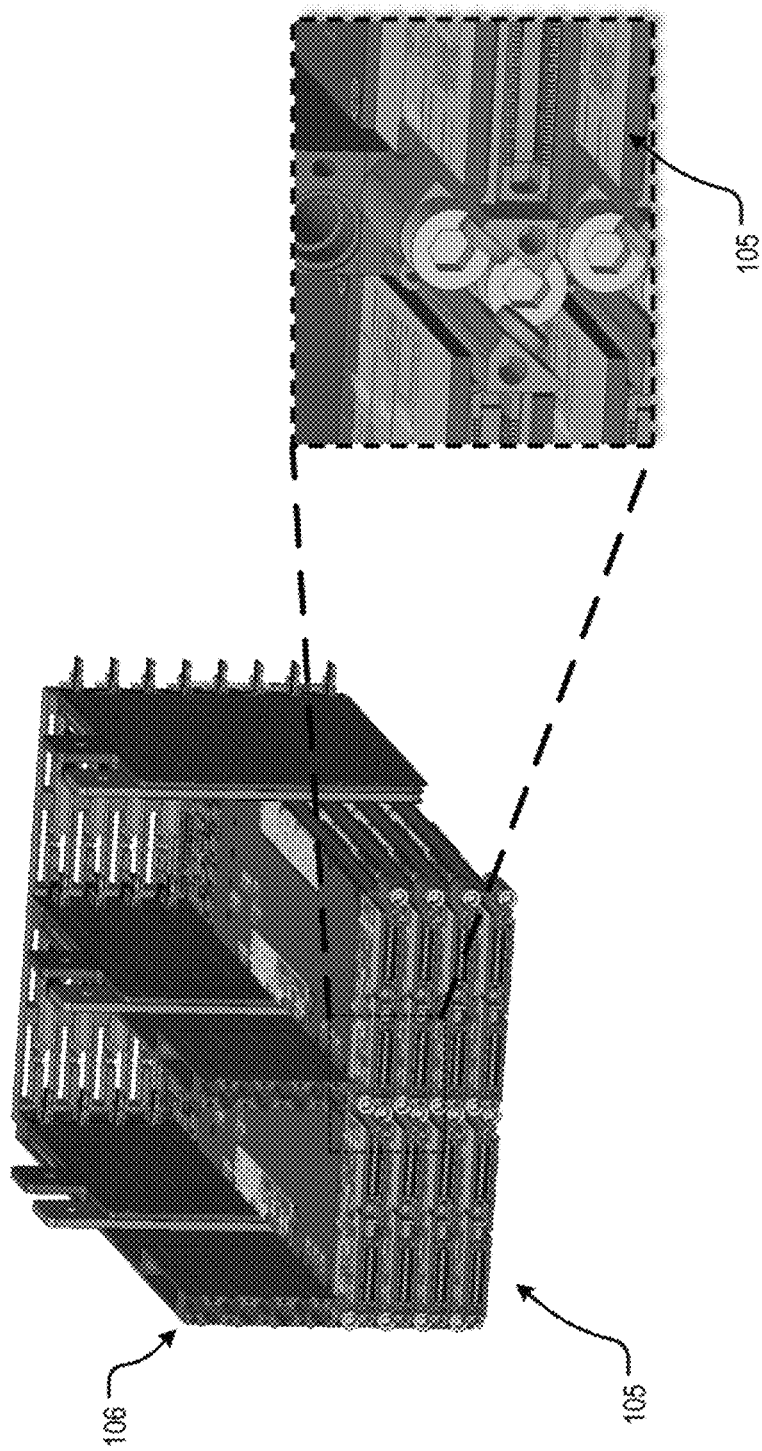

MOUNTING SYSTEM WITH COOLANT CONNECTION HAVING A SELF-SEALING IN-LINE VALVE AND COMPONENTS AND METHODS THEREOF

BACKGROUND

The present disclosure relates to form factor-conscious line-replaceable units in high density electronics.

Modern high power electronics line-replaceable units often require liquid cooling from a central manifold structure in order to maintain reasonable working temperatures. As these systems may also have numerous electrical interconnects, robust mating features are often required in order to prevent separation of the line-replaceable unit from the central manifold under shock or vibration. The electrical interconnects may also require extraction features for decoupling the two sides so the line-replaceable unit can be removed and replaced.

For tightly packaged electronic systems such as high frequency radar arrays, the above-described functions may benefit from being combined into a single form factor-conscious solution.

The foregoing "Background" description is for the purpose of generally presenting the context of the disclosure. Work of the inventors, to the extent it is described in this background section, as well as aspects of the description which may not otherwise qualify as prior art at the time of filing, are neither expressly or impliedly admitted as prior art.

SUMMARY

The present disclosure relates to a mounting system and method for form efficient cooling of high density electronics.

According to an embodiment, the present disclosure further relates to a system for reversibly-coupling an electrical unit to a structure, comprising a fastener for the electrical unit, the fastener having a base and a projection, the projection having a proximal portion and a distal portion, the fastener being at least partially-threaded along the projection, a plurality of seals disposed radially along the projection, wherein a channel extends along a longitudinal axis of the fastener from the distal portion of the projection toward the proximal portion of the projection, one or more outlets are disposed along the projection, the one or more outlets providing fluid communication between the channel and an external environment of the fastener, and the fastener is configured to be reversibly-coupled to a mating fastener of the structure such that, when coupled, the electrical unit is rigidly coupled to the structure and fluid is able to flow therebetween.

According to an embodiment, the present disclosure further relates to a system for reversibly-coupling an electrical unit to a structure, comprising a fastener of the electrical unit, having a base and a projection, the projection having a proximal portion and a distal portion, the fastener being at least partially-threaded along the projection, a plurality of seals disposed radially along the projection, and a mating fastener having an inner diameter and an outer diameter, the inner diameter defining a cavity and having a surface that is at least partially-threaded, and the outer diameter defining a mating external environment and having a surface that is at least partially-threaded, wherein a channel extends along a longitudinal axis of the fastener from the distal portion of the projection toward the proximal portion of the projection, one or more outlets are disposed along the projection, the one or more outlets providing fluid communication between the channel and an external environment of the fastener, and the fastener is reversibly-coupled to the mating fastener such that, when coupled, the electrical unit is rigidly coupled to the structure and fluid is able to flow therebetween.

According to an embodiment, the present disclosure further relates to a method of reversibly-coupling an electrical unit to a structure, comprising providing, within the electrical unit, a fastener having a base and a projection, the projection having a proximal portion and a distal portion, the fastener being at least partially-threaded along the projection, providing a plurality of seals disposed radially along the projection, and providing, within the structure, a mating fastener, having an inner diameter and an outer diameter, the inner diameter defining a cavity and having a surface that is at least partially-threaded, and the outer diameter defining a mating external environment and having a surface that is at least partially-threaded, wherein a channel extends along a longitudinal axis of the fastener from the distal portion of the projection toward the proximal portion of the projection, one or more outlets are disposed along the projection, the one or more outlets providing fluid communication between the channel and an external environment of the fastener, and the fastener is reversibly-coupled to the mating fastener such that, when coupled, the electrical unit is rigidly coupled to the structure and fluid is able to flow therebetween. In an embodiment, the method further comprises actuating, in a first direction, the mating fastener until at least one seal at a proximal end of the mating fastener is fluidly-sealed with the structure, actuating, in a second direction opposite the first direction, the fastener until the fastener is reversibly-coupled with the at least partially-threaded surface of the inner diameter of the mating fastener, actuating, in the second direction, the reversibly-coupled fasteners until at least one inlet disposed within the mating fastener is fluidly-exposed to allow fluid flow through the mating fastener and the fastener, and actuating, in the first direction and in order to cease fluid flow between the fastener and the mating fastener, the reversibly-coupled fasteners until the fastener and the mating fastener are decoupled.

The foregoing paragraphs have been provided by way of general introduction, and are not intended to limit the scope of the following claims. The described embodiments, together with further advantages, will be best understood by reference to the following detailed description taken in conjunction with the accompanying drawings.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein:

FIG. 1 is an illustration of a mounting system including a manifold and a line-replaceable unit coupled thereto, according to one or more embodiments of the present disclosure;

DETAILED DESCRIPTION

The terms "a" or "an," as used herein, are defined as one or more than one. The term "plurality," as used herein, is defined as two or more than two. The term "another," as used herein, is defined as at least a second or more. The terms "including" and/or "having," as used herein, are defined as comprising (i.e., open language). Reference throughout this document to "one embodiment," "certain embodiments," "an embodiment," "an implementation," "an example" or similar terms means that a particular feature, structure, or characteristic described in connection with the embodiment is included in at least one embodiment of the present disclosure. The terms "liquid coolant" and "coolant" may be used interchangeable throughout the document, though, it can be appreciated that a variety of coolants, including gas and liquid, may be suitable to serve as a coolant in an embodiment of the present disclosure. Thus, the appearances of such phrases or in various places throughout this specification are not necessarily all referring to the same embodiment. Furthermore, the particular features, structures, or characteristics may be combined in any suitable manner in one or more embodiments without limitation.

When mounting line-replaceable units (LRUs) to their parent structure in high density electronics such as high-frequency radar, there are often space limitations for mounting fasteners, extraction features, and liquid coolant connections. These high density electronics can require the mounting of an LRU 105 to a manifold 106, such as shown in FIG. 1. The manifold 106 can provide electrical and coolant (e.g., fluid coolant such as gas, liquid, and the like) connections between the LRU 105 and the manifold 106. The compact nature of the design architecture is highlighted in the magnified image of FIG. 1, wherein multiple fastener heads can be presented in an offset fashion in order to increase the density of the structure. In an example, each fastener head may be a component of a fastener having a ~¼" diameter, and each LRU 105 may have a width of ~3.5".

The interconnects that provide for mounting of the LRU 105 to the manifold 106, for replacement of the LRU 105, and for coolant flow from the manifold 106 to the LRU 105, if provided as separate connections, can increase the bulk of the mounting system.

According to embodiments of the disclosed subject matter, the present disclosure describes a device that can provide simultaneous mechanical fixation and coolant flow for temperature control of LRUs. According to embodiments of the disclosed subject matter, such device may be referred to herein as a "fastener."

Figures 2A, 2B:
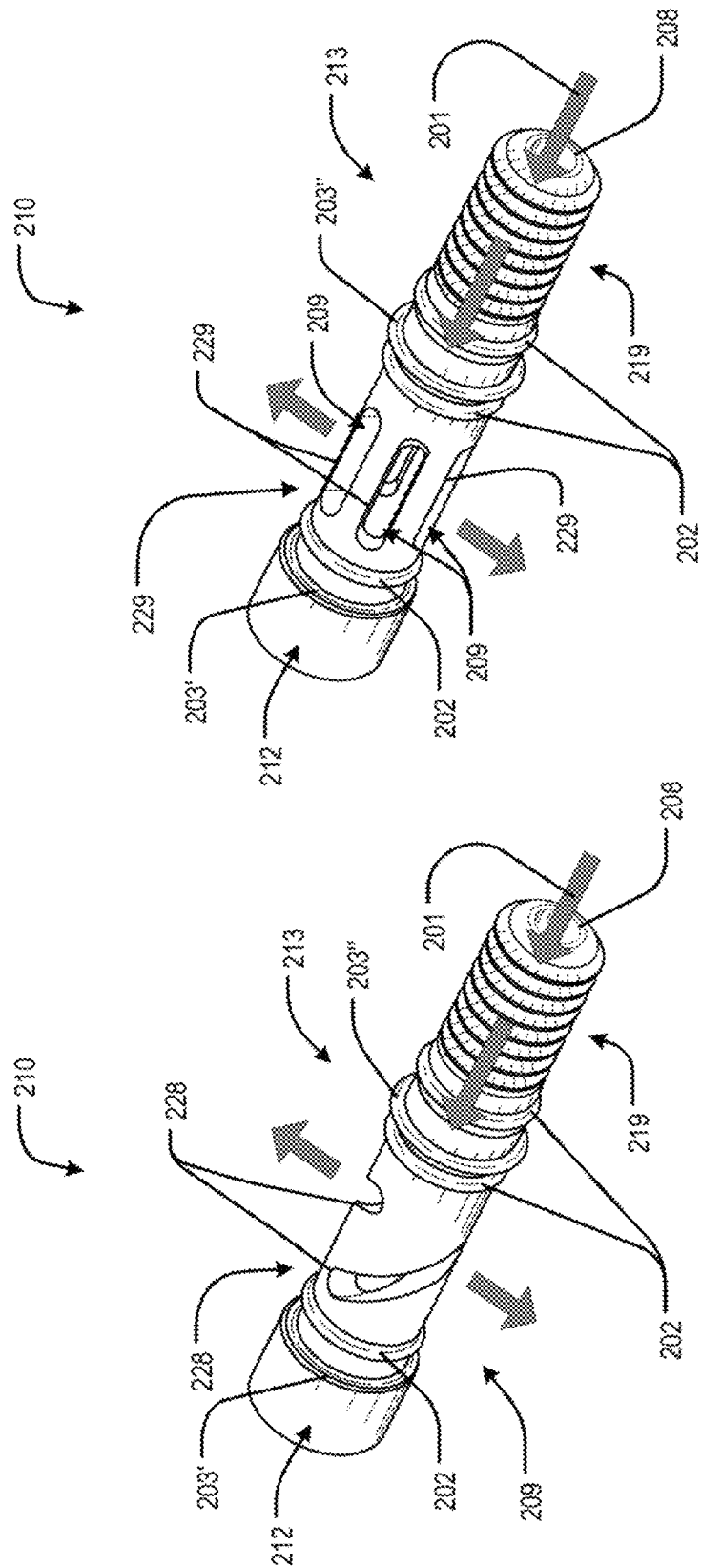
FIG. 2A is an illustration of a fastener of a mounting system, according to an exemplary embodiment of the present disclosure.
FIG. 2B is an illustration of a fastener of a mounting system, according to another exemplary embodiment of the present disclosure.

With reference to FIG. 2A and FIG. 2B, a fastener according to embodiments of the disclosed subject matter can be a fastener 210 that can include a fastener head 212 and a projection 213 extending from the fastener head 212. In an example, the fastener 210 may be fabricated from hardened steel. Further, as a non-limiting example, the projection 213 of the fastener 210 can be 1" to 2" in length with an outer diameter of 0.25". The fastener head 212 can have an outer diameter greater than the outer diameter of the projection 213. It can be appreciated, however, that manufacturing materials and dimensions of fasteners according to embodiments of the disclosed subject matter can be determined in accordance with the demands of the use environment in order to provide functionality similar to that described herein.

In an embodiment, the projection 213 can have an outer diameter smaller than an outer diameter of the fastener head 212. A first face seal 203' can be affixed at an interface where the projection 213 abuts the fastener head 212. A second face seal 203" can be affixed circumferentially at a distal portion of the projection 213 and can be adapted to contact a face of a manifold. The first face seal 203' and the second face seal 203" can be a rubber gasket and can serve to, in an embodiment, seal the mounting system when the fastener 210 is fully engaged with an LRU which is engaged with a manifold, as discussed in more detail below. In an example, the first face seal 203' and the second face seal 203" can have a rectangular cross-section and can be circumferentially disposed about the projection 213. An internal diameter of each of the first face seal 203' and the second face seal 203" can be substantially equivalent to an outer diameter of the projection 213. At a distal end of the projection 213, screw threads 219 may be disposed along an external surface of the projection 213. The screw threads 219 disposed along the external surface of the projection 213 may extend along a predetermined length of the projection 213. In one or more embodiments, the predetermined length may be a full length of the projection 213. In another instance, the predetermined length may be a fractional length, such as shown in FIG. 2A and FIG. 2B.

According to an embodiment, the projection 213 can include an internal channel defined by an inlet 208 at the distal end of the projection 213. The channel can extend from the distal end of the projection 213 to the fastener head 212 or a predetermined distance therebetween. In an example, the channel can extend from the distal end of the projection 213 to one or more outlets 209, for instance, to an end-most portion of one or more outlets 209 closest to the fastener head 212. When used for reversibly-mounting an LRU and a manifold, such LRU 105 and manifold 106 as shown in FIG. 1, the screw threads 219 of the fastener 210 can provide mechanical fixation with the manifold 106 while the inlet 208 at the distal end of the projection 213 and the one or more outlets 209 can allow for flow 201 of coolant between the LRU 105 and manifold 106.

In an embodiment, during use, the flow 201 of coolant can proceed from the inlet 208, through the channel of the projection 213, and can be output through the one or more outlets 209. As shown, each of the one or more outlets 209 can be considered radial outlets in that they can allow flow of coolant radially outward or generally radially outward from the channel of the projection 213. The one or more outlets 209 can be configured to be in fluid communication with a coolant channel of an adjacent cold plate of the LRU 105. Accordingly, the position of the one or more outlets 209, and the predetermined length of the channel within the projection 213, can be based upon a location of the coolant channel of the adjacent cold plate of the LRU 105.

In an embodiment, and when the screw threads 219 extend the full length of the projection 213, the position of the one or more outlets 209 may overlap with the screw threads 219 relative to structures of the LRU 105. Alternatively, in an embodiment where the screw threads 219 extend the fractional length of the projection 213, the position of the one or more outlets 209 may be within regions that are unthreaded.

According to an embodiment, the one or more outlets 209 can be, as in FIG. 2A, one or more spiral outlets 228 or, as in FIG. 2B, one or more longitudinal outlets 229. Notably, in addition to above, the geometry and/or position of the one or more outlets 209 can be based upon the location of the coolant channel of the adjacent cold plate of the LRU 105. For example, if the coolant channel of the adjacent cold plate of the LRU 105 is defined by a relatively small aperture and is positioned such that only a fraction of the external surface of the fastener 210 is in contact at any given time, the one or more outlets 209 can be shaped, sized, and/or arranged to ensure that constant pressure coolant flow and/or constant volume coolant flow is provided independent of the rotation of the fastener 210. That is, no matter the particular rotational positioning of the fastener 210 the one or more outlets 209 can be aligned with the coolant channel of the adjacent cold plate of the LRU 105 so as to provide coolant flow to the cold plate at a constant pressure and/or constant volume.

In contrast, it can be appreciated that a single, relatively small diameter hole in the projection 213 of the fastener 210 may be insufficient as it may become occluded during certain rotations of the fastener 210. For instance, if an inflow to the coolant channel of the adjacent cold plate of the LRU 105 is positioned at 90° relative to a longitudinal axis of the projection 213, a single, relatively small diameter hole may be occluded by an internal surface of the LRU 105 when the single, relatively small diameter hole is not similarly positioned relative to 90°. Moreover, even partial occlusion of the single, relatively small diameter hole may result in an unexpected pressure of coolant provided to the LRU 105. Accordingly, in view of these considerations, the one or more outlets 209 according to embodiments of the disclosed subject matter, such as the one or more spiral outlets 228 of FIG. 2A and the one or more longitudinal outlets 229 of FIG. 2B, can allow for constant pressure and/or constant volume coolant flow independent of the rotation of the fastener 210. The manufacturing materials and dimensions of the fastener 210 can be determined to provide sufficient mechanical support in view of the design of the one or more outlets 209. Additionally, it can be appreciated that a variety of geometrical configurations and arrangements may be considered for the one or more outlets 209, including those described above.

According to an embodiment, in addition to the first face seal 203' and the second face seal 203", or plurality of face seals, the fastener 210 can include a plurality of radial seals 202 covering a circumference of the projection 213. The plurality of radial seals 202 can be disposed at (including adjacent to) each end of the one or more outlets 209, for instance, to create a fluid connection for the flow 201 of coolant between the channel of the projection 213 and the coolant channel of the adjacent cold plate of the LRU 105. Each of the plurality of radial seals 202 can be a rubber gasket of a sufficient size to provide a fluid seal. In an embodiment, each of the plurality of radial seals 202 can have an inner diameter relatively smaller than an outer diameter of the projection 213, an outer diameter relatively larger than the outer diameter of the projection 213, and can be seated within a circumferential groove of the projection. In an example, at least one of the plurality of radial seals 202 can have a cross-sectional area in the shape of a rectangle or circle. Additionally, the plurality of radial seals 202 can ensure that, during mating and un-mating of the LRU 105 from the manifold 106, coolant is not leaked from the mounting system. In an example, a distance between radial seals 202 disposed at each end of the one or more outlets 209 is such that actuation of the fastener 210 can be performed to mount or un-mount the LRU 105 from the manifold 106 without disrupting the fluid seal created by the radial seals 202 disposed at each end of the one or more outlets 209.

According to an embodiment, the fastener 210 can include a jacking stop feature (not shown in FIG. 2A or FIG. 2B) to allow for rapid removal and replacement of the LRU 105. The jacking stop feature is arranged within the LRU 105 to limit translation of the fastener 210 during unmating and to cease coolant flow between the fastener 210 and the manifold 106. Concurrently, translation of the fastener 210 is limited such that coolant flow between the LRU 105 and the fastener 210 remains fluidly sealed within respective internal channels of the LRU 105 and the fastener 210. The LRU 105 can then be removed from the manifold 106 without risking liquid damage to electrical components by contact of coolant with components of the system. An example of a jacking stop feature 307 configured to limit translation of the fastener 210 is shown in FIG. 3B and can be one of a variety of means of limiting motion such as a set screw, a block, and the like.

Figure 3A:
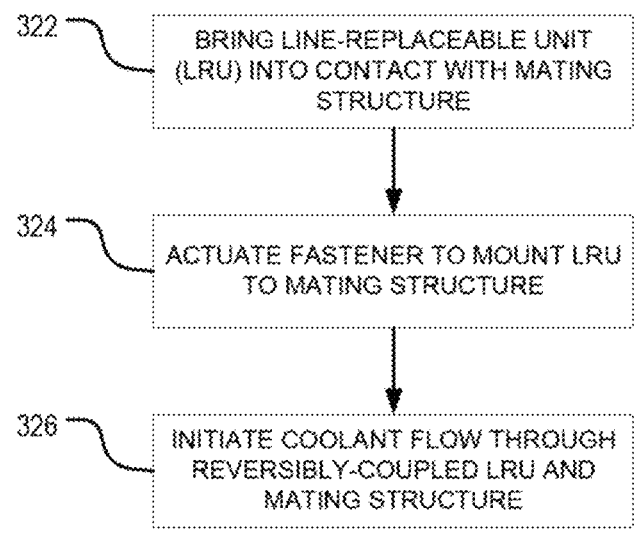
FIG. 3A is a flow chart pertaining to a mounting system, according to an exemplary embodiment of the present disclosure.
Figure 3B:
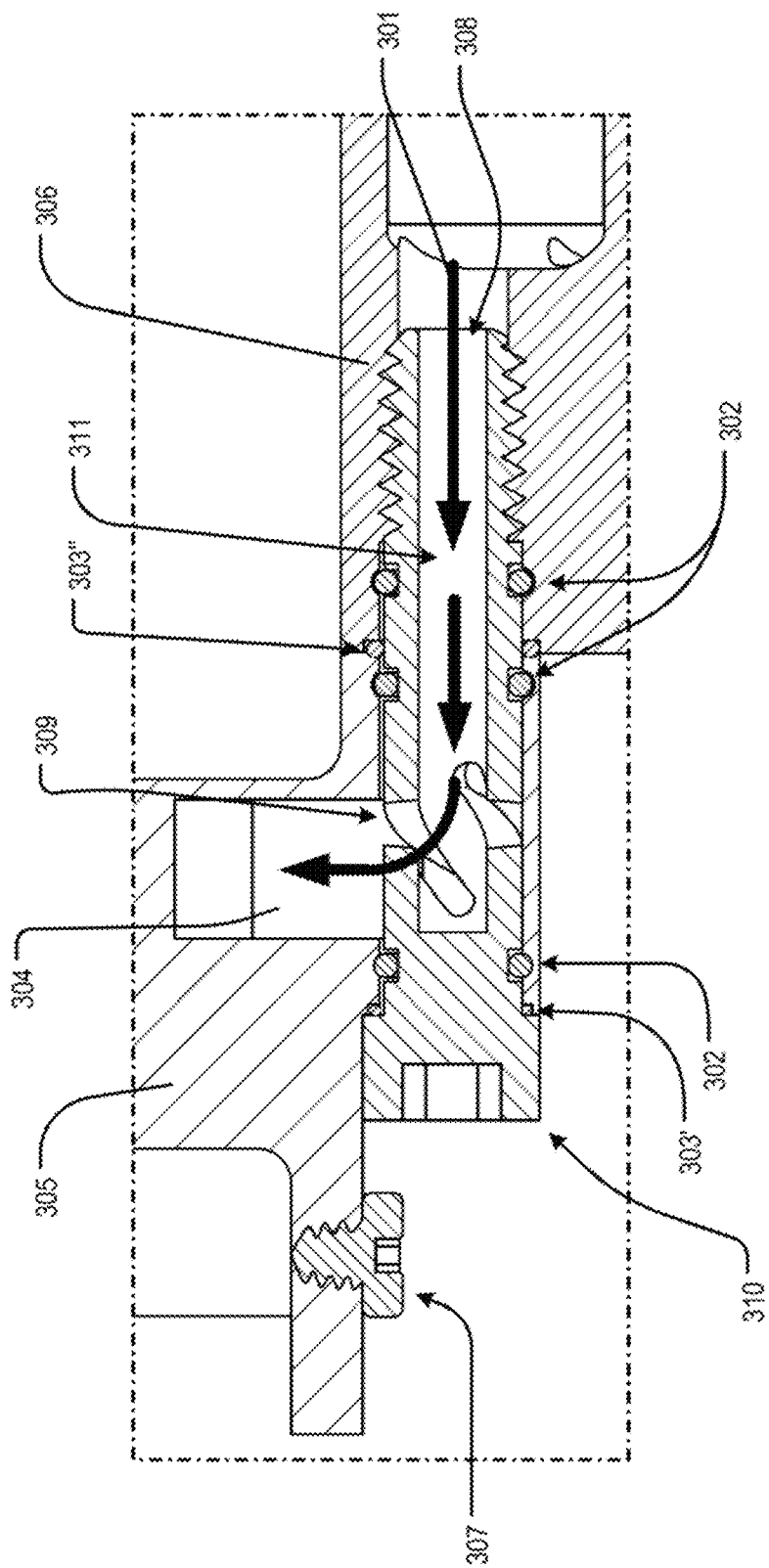
FIG. 3B is a cross-sectional schematic of a mounting system, according to an exemplary embodiment of the present disclosure.

The flow diagram of FIG. 3A and cross-sectional schematic of FIG. 3B describe an application of a fastener according to embodiments of the disclosed subject matter, such as the fastener 210 of FIG. 2A or FIG. 2B, for reversibly-mounting, or reversibly-coupling, an LRU and a structure, such as manifold 106 via the fastener.

At step 322 of FIG. 3A, the LRU can be brought into contact with a mating structure. The mating structure, in the context of the present disclosure, can be a manifold configured to be a source for electrical connections and coolant for the LRU.

At step 324, a fastener, such the fastener 210 as described in FIG. 2A or FIG. 2B, can be actuated in order to mechanically secure the LRU to the manifold and to bring one or more outlets 209 of the fastener 210 into close proximity, and in fluid communication, with a coolant channel of a cold plate of the LRU. In an example, actuation of the fastener 210 includes rotation of the fastener 210 and as a result, via threaded surface of the fastener 210, translation of the fastener 210. In doing so, a channel connected to an inlet of the projection 213 of the fastener 210 can provide a pass-through for coolant flow from the manifold to the LRU, and radial seals 202 and/or face seals 203', 203" of the fastener 210 can prevent leaking from the mechanically-secured LRU and manifold.

At step 326, the coolant flow from the manifold can be initiated. The coolant may flow from the manifold, through the channel of the projection 213 of the fastener 210, and into the coolant channel of the cold plate of the LRU via the one or more outlets 209 of the fastener 210.

FIG. 3B reflects an exemplary mounting of an LRU 305 to a manifold 306. Having mechanically-secured the LRU 305 to the manifold 306, flow 301 of coolant from the manifold 306 may proceed through an inlet 308 and an internal channel 311 of a projection of a fastener 310. The flow 301 can exit the channel 311 of the projection via one or more outlets 309 positioned proximate a coolant channel 304 of the LRU 305. A first face seal 303', a second face seal 303", and plurality of radial seals 302 can be provided, as described with regard to FIG. 2A and FIG. 2B. Such seals 302, 303', 303" can provide a fluid seal during coolant flow 301.

According to an embodiment, and as described above, the present disclosure can combine a captive mounting fastener with a sealed coolant connection. The captive mounting fastener can include an outlet configuration (e.g., multiple outlets) to ensure consistent flow and pressure regardless of fastener orientation. Therefore, independent of the direction at which the fastener (e.g., screw) is actuated and the angle at which the fastener is rotated, once tightened, coolant flow from the fastener can be maintained. This may result in no flow imbalance between multiple LRUs due to varying pressure drops.

In addition to a means for mechanical fixation and fluid communication at a coolant channel of an LRU, the following discussion and figures are directed to preventing leakage from a manifold-side during replacement of an LRU.

With reference again to FIG. 3B, it can be appreciated that, during replacement of the LRU 305, residual coolant at the interface between the LRU 305 and the manifold 306 may be leaked from the mounting system. This may lead to potential electrical failures and the like. Accordingly, in addition to the above, an improved, reversible liquid coolant connection, according to embodiments of the disclosed subject matter, can ensure efficient and safe replacement of LRUs.

Figure 4:
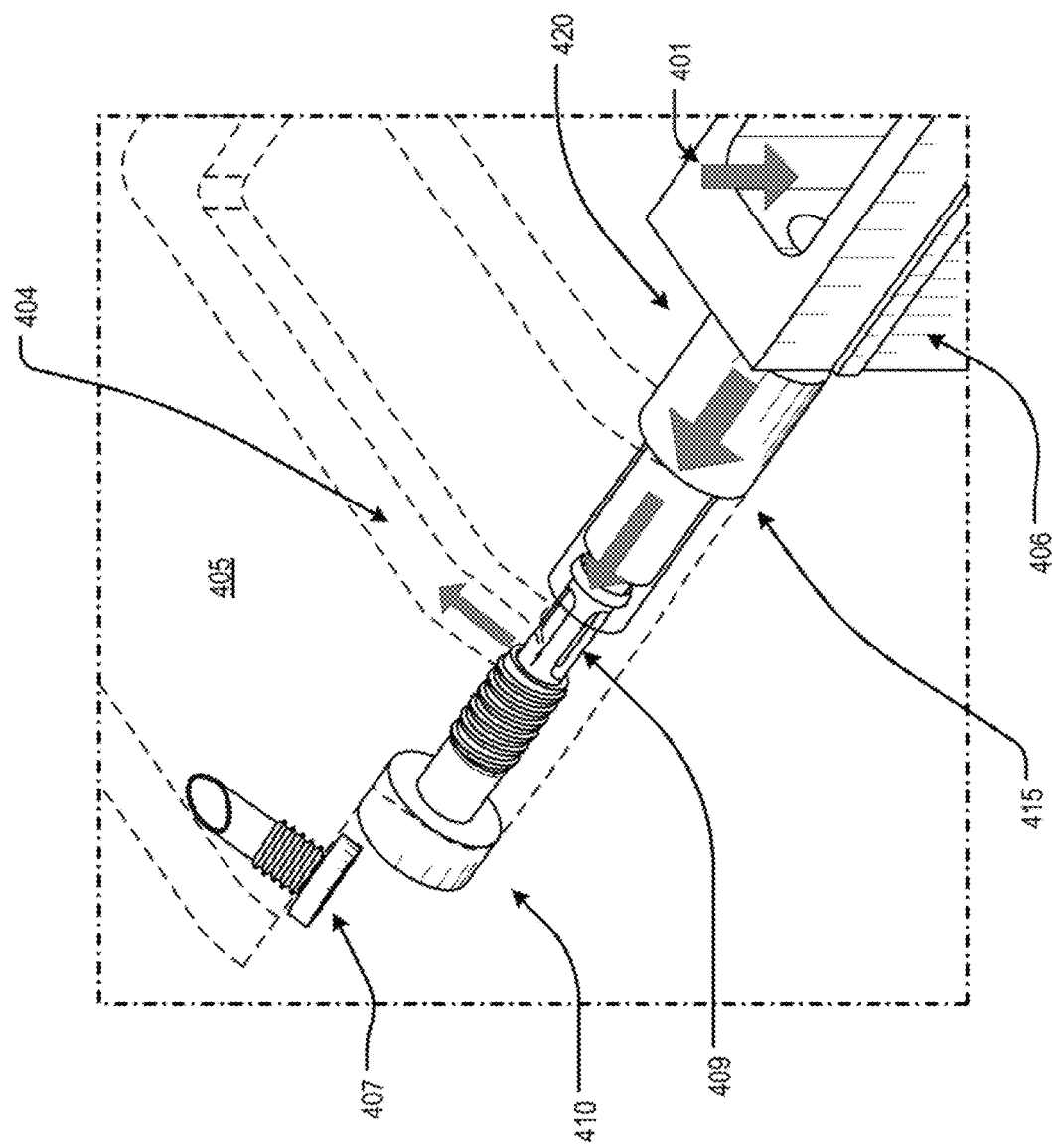
FIG. 4 is an illustration of a mounting system, according to an exemplary embodiment of the present disclosure.

FIG. 4 is a high-level graphical introduction to a liquid coolant connection according to embodiments of the present disclosure. A manifold 406 can be mounted to an LRU 405 by a first fastener 410 and a second fastener 420. In an example, the 'first fastener' may be referred to as a 'fastener' and the 'second fastener' may be referred to as a 'mating fastener.'. First, electrical connections between the LRU 405 and the manifold 406 can be made. Then, reversible-coupling of the first fastener 410 to the second fastener 420 can form a coolant connection 415. It can be appreciated that, in being reversibly-coupled, the first fastener 410 and the second fastener 420 are able to be mated and un-mated based upon actuation of one or more of the first fastener 410 and the second fastener 420, the mated state being when the first fastener 410 and the second fastener 420 are coupled and fluid flow therebetween is possible via the coolant connection 415. Accordingly, the LRU 405 and the manifold 406 may transition between a separated, dismounted state and a coupled, mounted state, the LRU 405 and the manifold 406 being separable when the first fastener 410 and the second fastener 420 are un-mated.

In an embodiment, the first fastener 410 may be substantially similar to those described with respect to FIG. 2A through FIG. 3B. In another embodiment, the first fastener 410, while maintaining the function of coolant flow, may have structural modifications, as outlined in subsequent figures, in order to allow coupling with the second fastener 420.

In an embodiment, the second fastener 420 may have a connection such as a quick disconnect coupling and the like. It can be appreciated, however, that the second fastener 420 may be any type of fastener allowing for a reversibly-sealed coolant connection between the first fastener 410. In the example of FIG. 4, the coolant connection 415 can allow for flow 401 to proceed as indicated, including through one or more outlets 409 of the first fastener 410 and into a coolant channel 404 of the LRU 405 when the first fastener 410 and the second fastener 420 are mated. When the first fastener 410 and the second fastener 420 un-mated, the first fastener 410 being constrained by a jacking stop feature 407, the flow of coolant can be automatically-sealed, as discussed in more detail below.

Figure 5:
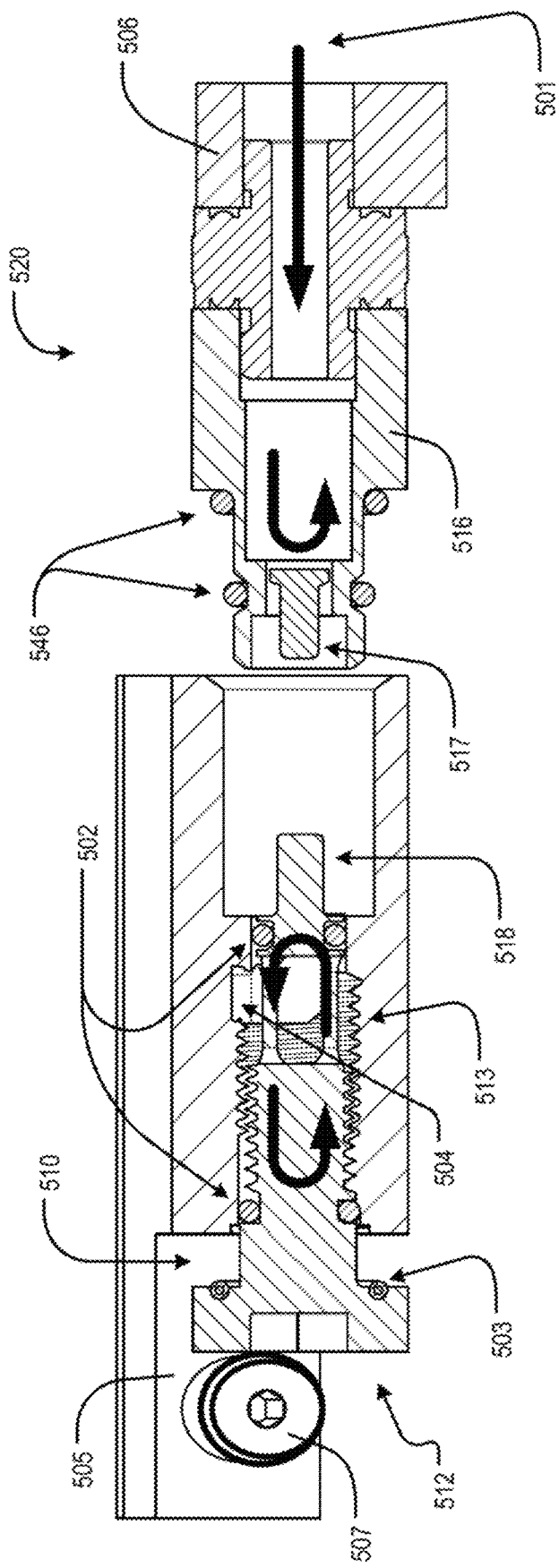
FIG. 5 is a cross-sectional schematic of a mounting system having a quick disconnect fluid connection and being in a decoupled position, according to an exemplary embodiment of the present disclosure.

FIG. 5 provides a schematic of the liquid coolant connection of FIG. 4 in an un-mated state, wherein a first fastener 510 of an LRU 505 and a second fastener 520 of a manifold 506 are de-coupled. In an example, the second fastener 520 can be a quick disconnect fluid coupling 516. In order to removably engage the first fastener 510 and the quick disconnect coupling 516, a plunger 518 can be provided. The plunger 518, which may be considered part of the first fastener 510, can be configured to interact with and/or actuate a pin 517 of the quick disconnect coupling 516. The plunger 518 may be a generally-cylindrical protrusion extending from or adjacent to a distal end of the first fastener 510. The plunger 518 may extend from at or adjacent to a distal end of a distal portion of a projection 513 of the first fastener 510. The pin 517 of the quick disconnect coupling 516 may act as, in an instance, an in-line valve or similar component, actuatable between an open state and a closed state (shown in FIG. 5). The pin 517 may be a spring-loaded pin or the like. It can be appreciated that, in an un-mated state, the plunger 518 can be out of contact with the pin 517 of the quick disconnect coupling 516, where the un-actuated pin 517 can prevent flow 501 of liquid coolant out of the quick disconnect coupling 516. The pin 516 of the quick disconnect coupling 516 can allow, from the perspective of the manifold 506, un-mating of the LRU 505 without the need for draining system coolants prior thereto.

Regarding flow 501 of liquid coolant, thick black arrows within the schematic of FIG. 5 indicate a direction of coolant flow 501 when the first fastener 510 and the second fastener 520 are in an un-mated state. A similar scheme will be used in subsequent figures. In an embodiment, wherein the manifold 506 and the LRU 505 are in an un-mounted state, coolant flow 501 from the manifold 506 can be maintained within the manifold 506 via the quick disconnect coupling 516. Similarly, residual coolant flow within the first fastener 510, in an example, can be maintained between the first fastener 510 and a coolant channel 504 of the LRU 505. The un-mounted state may reflect an instance before the LRU 505 is mounted to the manifold 506, or an instance after un-mounting the first fastener 510 from the quick disconnect coupling 516 following coupling thereof. In either instance, as indicated, flow 501 of liquid coolant can be maintained within the manifold 506 and/or within the LRU 505, thereby preventing leakage of liquid coolant therefrom. To this end, a plurality of end seals 546 may be disposed on an external surface of the quick disconnect coupling 516 and a face seal 503 and a plurality of radial seals 502 may be disposed on the projection 513 of the first fastener 510 in order to prevent leakage of liquid coolant from the mounting system in the un-mounted state.

As shown in FIG. 5, a distal radial seal of the plurality of radial seals 502 can be disposed on a distal end of the first fastener 510 proximate the plunger 518. In an embodiment, during un-mating of the first fastener 510 from the second fastener 520, a jacking stop feature 507 disposed on the LRU 505 can limit translation of a head 512 of the first fastener 510 such that the distal radial seal of the plurality of radial seals 502 is not exposed to a coolant channel 504 of the LRU 505, and thereby compromising a seal thereof. The jacking stop feature 507, or other translational limit, therefore, can ensure the seal of the plurality of radial seals 502 of the first fastener 510.

As introduced above, the liquid coolant connection described in FIG. 5 can expedite LRU replacement by eliminating the need for system drainage prior to un-mating and/or decoupling electrical connections and coolant connections. In view of a practical application, such as Array Radar applications, traditional installation of an LRU may involve blind mating of electrical connections including multiple power, digital, and radiofrequency connector interfaces. In some cases, a blind mate liquid connection may also be required, thereby increasing the required insertion force and/or increasing the probability of leaks when the mounting system, writ large, is considered. In order to avoid these outcomes, a liquid coolant connection, as described in FIG. 5, can be implemented. In this way, electrical connections may be mated while liquid coolant connections can remain closed, a pin, or in-line valve, for instance, only being actuated after successful electrical connection.

Figure 6A:
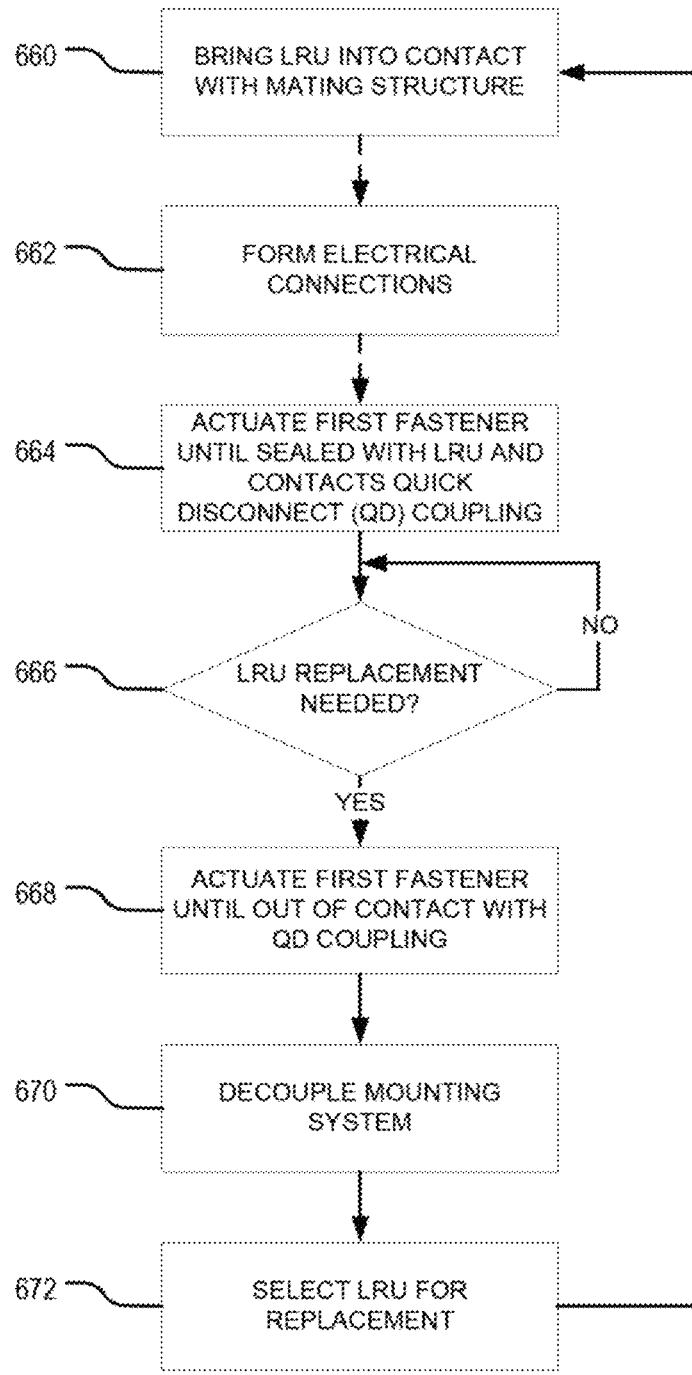
FIG. 6A is a flow chart pertaining to a mounting system, according to an exemplary embodiment of the present disclosure.

The process alluded to above will now be described with reference to FIG. 6A. FIG. 6A, in view of FIG. 6B and FIG. 6C, describes a process 650 of replacing an LRU.

At step 660 of process 650, the LRU 605 can be brought into contact with the manifold 606. Such contact can include alignment of a plurality of connections of the LRU 605 and the manifold 606, including electrical connections, fluid connections and the like.

Figure 6B:
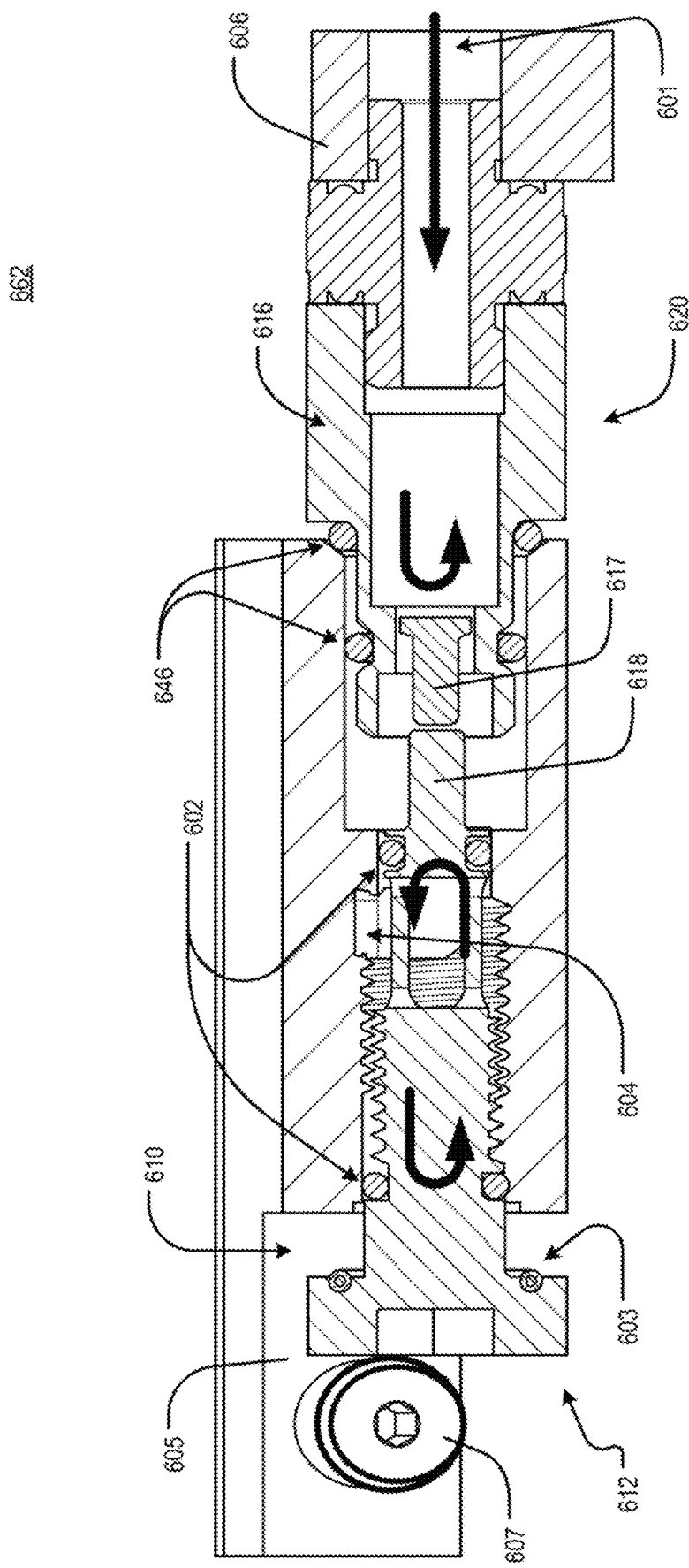
FIG. 6B is a cross-sectional schematic of a mounting system having a quick disconnect fluid connection and being in an intermediate position, according to an exemplary embodiment of the present disclosure.

At step 662 of process 650, while fluid connections remain in an un-mated position, electrical connections between the LRU 605 and the manifold 606 may be formed. An aspect of step 662 of process 650 is illustrated in FIG. 6B.

A first fastener 610 associated with the LRU 605 and a second fastener 620, or quick disconnect coupling 616, associated with the manifold 606 are shown proximate one another. A head 612 of the first fastener 610 is an un-actuated state, wherein translation of the first fastener 610 is limited by contact between the head 612 of the first fastener 610 and a jacking stop feature 607 (e.g., set screw and the like). In this position, flow 601 of liquid coolant from the manifold 606, a direction of which is indicated by thick black arrows within the schematic of FIG. 6B, is limited to the quick disconnect coupling 616, as a plunger 618 of the first fastener 610 is out of contact with a pin 617 of the quick disconnect coupling 616. Moreover, flow 601 between the first fastener 610 and a coolant channel 604 of the LRU 605 can be confined thereto, with possible leaking of coolant being limited by a face seal 603 and a plurality of radial seals 602 positioned along an external surface of a projection of the first fastener 610. Therefore, electrical connections may be made without concern for leaking of coolant from the coolant channel 604 of the LRU 605 or the coolant channel of the first fastener 610 leading to one or more outlets 609.

Once the electrical connections have been made, the fluid connections can be formed between the LRU 605 and the manifold 606 at step 664 of process 650. To this end, and with reference now to FIG. 6C, the first fastener 610 associated with the LRU 605 can be actuated such that the plunger 618 of the first fastener 610 engages and depresses the pin 617 of the quick disconnect coupling 616 (i.e., the second fastener 620) associated with the manifold 606. The interaction between the first fastener 610 and the quick disconnect coupling 616 can form a coolant coupling 615. The face seal 603 and the plurality of radial seals 602 of the first fastener 610 and the plurality of end seals 646 of the quick disconnect coupling 616 can form a fluid seal with the LRU 605. Concurrently, the face seal 603 of the first fastener 610 can engage with a surface of the LRU 605, ensuring fluid from the mounting system does not escape via the LRU 605. Each of the plurality of end seals 646 of the quick disconnect coupling 616 can be affixed to the quick disconnect coupling 616 and can be substantially similar in material, dimensionality, and structure to the plurality of radial seals 602 of the first fastener 610 and the face seal 603 of the first fastener 610, as appropriate.

In an embodiment, formation of the coolant coupling 615 between the first fastener 610 and the quick disconnect coupling 616 associated with the manifold 606 can initiate flow 601 of liquid coolant from the manifold 606, as formation of the coolant coupling 615 can require engagement of the plunger 618 of the first fastener 610 with the pin 617 of the second fastener 620. The flow 601, a direction of which is indicated by thick black arrows within the schematic of FIG. 6C, can pass the pin 617 and circumnavigate the plunger 618 of the first fastener 610 as it is no longer inhibited by the pin 617 of the quick disconnect coupling 616. As the first fastener 610 has been actuated and the coolant channel of the first fastener becomes exposed to coolant from the manifold 606, the flow 601 of liquid coolant can be allowed to proceed into the coolant channel of the first fastener 610. In an embodiment, a length of the one or more outlets 609 of the first fastener 610 may be such that a portion of the one or more outlets 609 is in fluid communication with the coolant channel 604 of the LRU 605 and with the flow 601 from the manifold 606. In this way, the one or more outlets 609 of the first fastener 610 may serve as an inlet for flow 601 from the manifold 606 and as an outlet, or conduit, to the coolant channel 604 of the LRU 605.

Figure 6C:
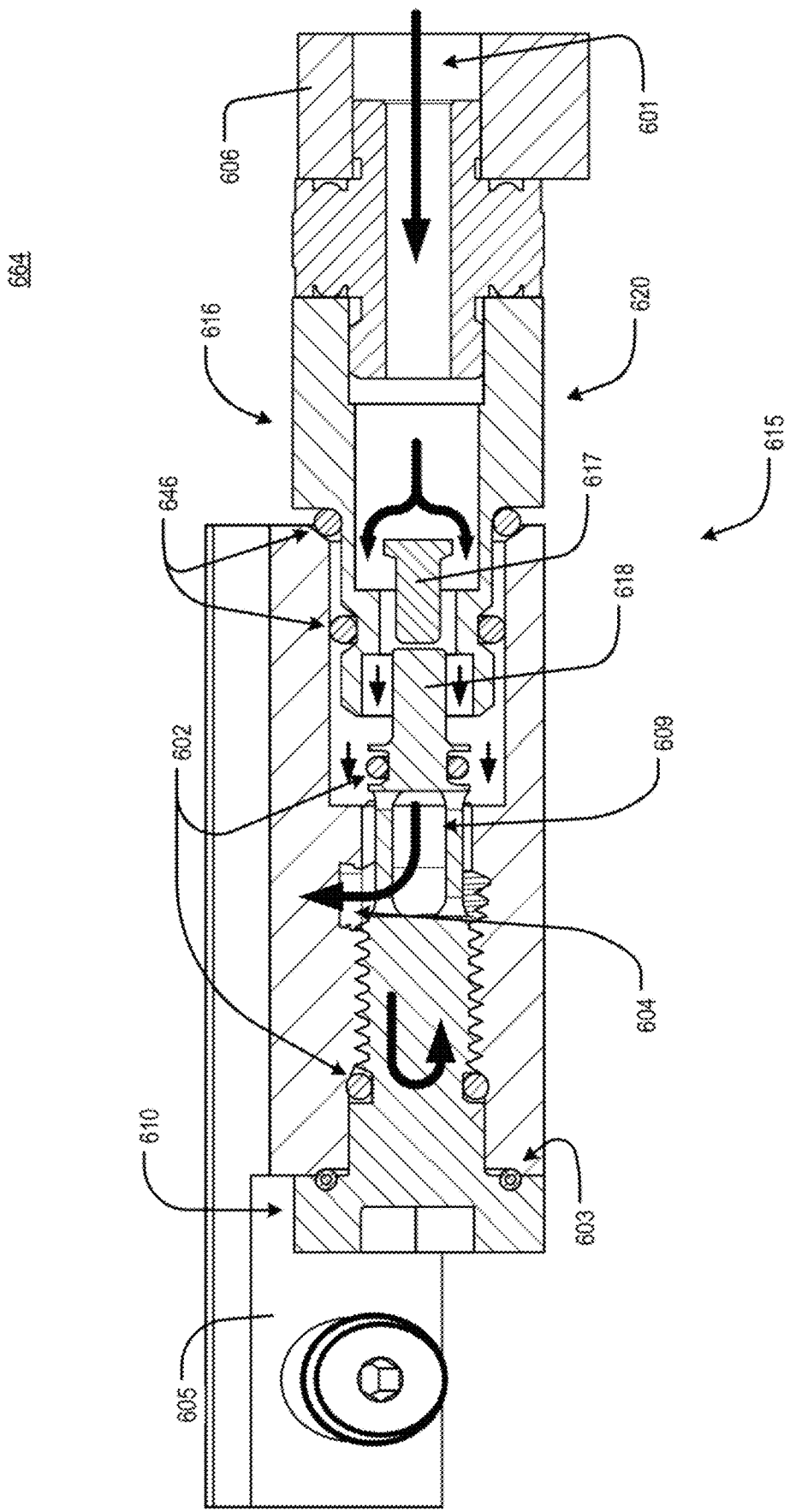
FIG. 6C is a cross-sectional schematic of a mounting system having a quick disconnect fluid connection and being in a coupled position, according to an exemplary embodiment of the present disclosure.

With formation of the coolant coupling 615 at step 664 of process 650 (as shown in FIG. 6C), liquid coolant may flow through the LRU 605 and provide a cooling function to the unit during operation. Upon cessation of a specific activity, however, it may become desirable to remove the current LRU 605 and replace it with an appropriate LRU for a future operation. At step 666 of process 650, it can be determined whether LRU 605 needs to be replaced. If it is determined that the current LRU 605 remains appropriate for a future task, no replacement is needed and the evaluation can be repeated. If, however, it is determined that the current LRU 605 is not sufficient for the future task, the process 650 can proceed to step 668 and the current LRU 605 can begin to be replaced.

At step 668 of process 650, and with reference again to FIG. 6B, the first fastener 610 can be actuated such that the plunger 618 is brought out of contact with the pin 617 of the quick disconnect coupling 616 (i.e., the second fastener 620). Such actuation can involve translation of the first fastener 610 (e.g., via unscrewing) such that head 612 of the first fastener 610 is caused to move toward the jacking stop feature 607 of the LRU 605. According to one or more embodiments, the heat 612 can contact the jacking stop feature 607, thereby limiting translation of the first fastener 610. In this state, with the pin 617 of the quick disconnect coupling 616 in an un-engaged state, the flow 601 of liquid coolant from the manifold 606 to the LRU 605 can be interrupted. The plurality of radial seals 602 of the first fastener 610, engaged with the internal surface of the LRU 605 on opposite sides of the coolant channel 604 of the LRU 605 can prevent leakage of residual liquid coolant from the LRU 605.

Upon cessation of the flow 601 of liquid coolant from the manifold 606, the fluid connection can be broken and any electrical connections, in turn, may be decoupled at step 670 of process 650. As indicated, the LRU 605 may be removed from attachment to the manifold 606 without the need for flushing the LRU 605 or otherwise accommodating for residual liquid coolant, as the plurality of radial seals 602 and design, writ large, of the mounting system can prevent fluid leakage.

At step 672 of process 650, an appropriate LRU can be installed, according to process 650, beginning at step 660.

In the embodiment described with respect to FIG. 6A through FIG. 6C, the second fastener 620 can be a quick disconnect engageable via the pin 617 by the plunger 618 of the first fastener 610. Such connection can provide an efficient means for initiating and ceasing flow of liquid coolant between the LRU 605 and the manifold 606.

In another embodiment, it may be desirable to provide, in addition to an easily connectable and reversible connection for the flow of liquid coolant, a robust mechanical connection between an LRU and a manifold. As will be described with respect to FIG. 7 through FIG. 10B, the second fastener may be a fastener and configured to engage the first fastener for the onset of flow of coolant. The initiation of flow of coolant, however, may require engagement of the first fastener with the second fastener such that the resulting fastener complex can be actuated in a direction. Such actuation and translational movement can control flow of coolant, allowing or ceasing flow based on the amount of translational movement.

Briefly, upon actuation of the first fastener, an external surface of the first fastener can engage an internal surface of the second fastener. When engaged, the first fastener can be further actuated, thereby actuating the first fastener and the second fastener together and translating the engaged unit, or fastener complex. Translation of the engaged unit, or fastener complex, can expose at least one inlet in the second fastener to flow of liquid coolant from the manifold, the flow being directed into a cavity of the second fastener, through the channel of the first fastener, and out the one or more outlets of the first fastener into the coolant channel of the LRU.

Figure 7:
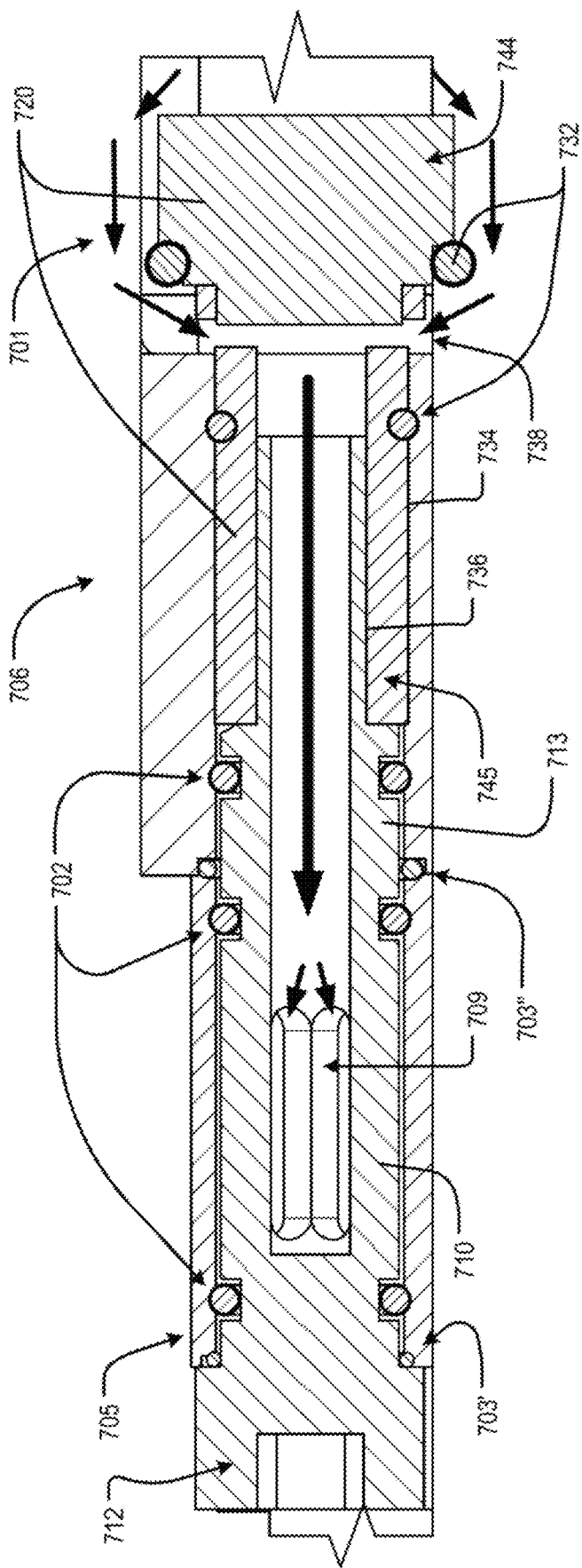
FIG. 7 is a cross-sectional schematic of a mounting system having a plurality of fasteners, according to an exemplary embodiment of the present disclosure.

More specifically, the above process will first be described with reference to FIG. 7, a cross-sectional schematic of a mounting system using a second fastener, according to an exemplary embodiment of the present disclosure, wherein the mounting system is in a coupled position and coolant is able to flow therethrough. The cross-section of the schematic of FIG. 7 is generated along an axis perpendicular to a longitudinal axis, or actuating axis, of a first fastener 710.

The mounting system can include an LRU 705 and a manifold 706 having, respectively, the first fastener 710, as described previously, and a second fastener 720, the first fastener 710 and the second fastener 720 being reversibly-coupled. The second fastener 720 can include a head 744 and a projection 745 extending therefrom. An external surface 734 of the second fastener 720 can secure the second fastener 720 with the manifold 706, while an internal surface 736 of the second fastener 720 can be configured to engage with a portion of the external surface of the first fastener 710. In an embodiment, a plurality of radial seals can be arranged along the external surface 734 of the second fastener 720. One or more apertures, or inlets 738, described in detail with respect to FIG. 8A and FIG. 8B, can be disposed proximate the head 744 of the second fastener 720 to allow for flow 701 of liquid coolant from the manifold 706 to the LRU 705 via a cavity of the second fastener 720 and a channel of the first fastener 710 when exposed. As before, the first fastener 710 can include a plurality of radial seals 702 arranged along the external surface of a projection 713 of the first fastener 710 and relative to one or more outlets 709 of the first fastener 710 in addition to a first face seal 703' proximate a head 712 of the first fastener 710 and a second face seal 703" disposed along the projection 713 of the first fastener 710. The head 712 can be actuatable, by rotation, to engage the first fastener 710 with the second fastener 720 during operation.

Figure 8B:
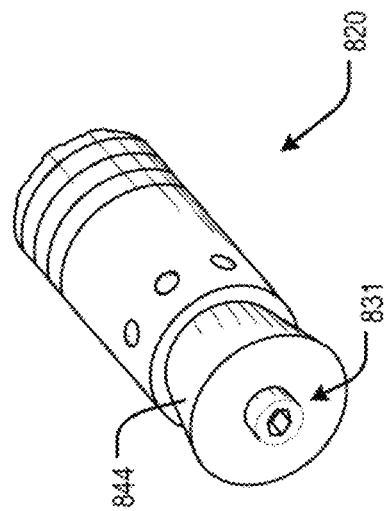
FIG. 8B is a perspective illustration of a fastener of a mounting system, according to an exemplary embodiment of the present disclosure.
Figure 8A:
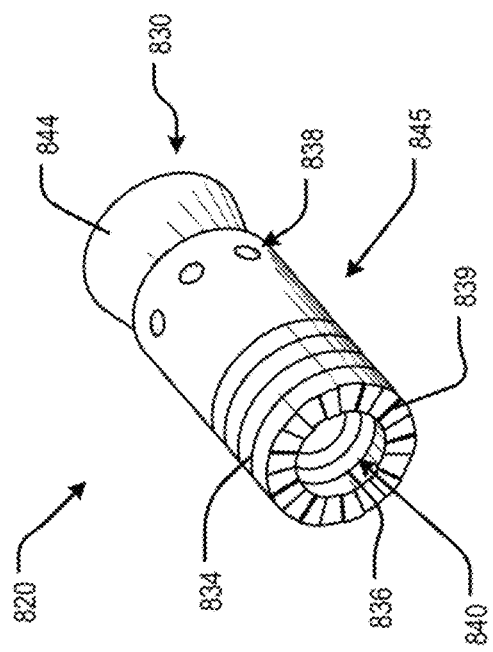
FIG. 8A is a perspective illustration of a fastener of a mounting system, according to an exemplary embodiment of the present disclosure.

An exemplary embodiment of the second fastener 720, introduced above, will be described in detail with reference to FIG. 8A and FIG. 8B. A second fastener 820 can include a head 844 and a projection 845 extending therefrom. In an embodiment, the head 844 of the second fastener 820 may be a gasket or a seal 830 such that, when in an un-mated state relative to the first fastener 710 associated with the LRU 705 of the mounting system, contact between an internal surface of the manifold 706 and the seal 830 of the second fastener 820 can prevent flow of liquid coolant therethrough.

The projection 845 of the second fastener 820 can be substantially cylindrical and can include an external surface 834 and an internal surface 836 defining a cavity 840. A distal end of the projection 845 of the second fastener 820 may be threaded on the internal surface 836 and on the external surface 834 for engagement with the first fastener 710 and with the manifold 706, respectively. At least one aperture, or at least one inlet 838, may be disposed within a proximal portion of the second fastener 820, such as shown in FIG. 8A and FIG. 8B. The at least one inlet 838 can be configured at a pre-determined distance from a proximal end of the projection 845 such that, when engaged by the first fastener 710 and translated relative to the actuation of the first fastener 710, the at least one inlet 838 of the second fastener 820 moves from a concealed position to an accessible position, the actuation of the coupled fasteners, or fastener complex, creating a fluid pathway from the manifold 706 to the LRU 705.

In an embodiment, the second fastener 820 may include a castellated feature 839 at a distal end of the projection 845. The castellated feature 839 may support the second fastener 820 in maintaining contact with the first fastener 710 during translation of the fastener complex. For instance, the castellated feature 839 may support the first fastener 710 in contacting the second fastener 820 when being introduced to the manifold 706. In reverse, the castellated feature 839 may support the first fastener 710 and the second fastener 820 in maintaining contact while the first fastener 710 is removed from the manifold 706. To this end, the fastener complex can be translated together until the second fastener 820 is secured within the manifold 706 and a fluid seal is created, at which point the first fastener 710 may disengage from the second fastener 820.

In an embodiment, the second fastener 820 may include a torque mechanism 831 or fastener drive feature disposed at a proximal end of the head 844. The torque mechanism 831, or fastener drive feature, may be configured to receive a tool to provide rotational motion to the second fastener 820 such that the second fastener 820 can engage with the manifold 706 of the mounting system. Prior to introducing the LRU 705 to the manifold 706, the second fastener 820 may be coupled to the manifold 706 via threads on the external surface 834 of the second fastener 820. In coupling the second fastener 820 to the manifold 706, the at least one inlet 838 can become concealed by an internal surface of the manifold 706 and the flow of liquid coolant therethrough may be prevented. Having coupled the second fastener 820 to the manifold 706, the manifold 706 is ready to receive the LRU 705, as was briefly described previously.

With reference now to the flow diagram of FIG. 9, the mounting system of FIG. 7, FIG. 8A, and FIG. 8B will now be described in view of LRU installation and replacement.

At step 990 of process 980, a step which may not repeated during LRU replacement, the second fastener associated with the manifold can be coupled to the manifold such that the at least one inlet of the second fastener is concealed. To this end, the torque mechanism of the head of the second fastener can be operated at a pre-determined torque to fully engage the second fastener with the manifold via external threads.

At step 991 of process 980, with the manifold prepared to receive the LRU, the LRU can be brought into contact with the manifold and initial connections are made. In particular, one or more electrical connections can be made prior to initiation of flow of liquid coolant.

At step 992 of process 980, the fluid connection between the LRU and the manifold may be made. Specifically, the first fastener may be actuated at a pre-determined torque until an external surface of the projection of the first fastener engages an internal surface of the projection of the second fastener via threads, for instance, forming a fastener complex, and providing a robust mechanical fixation. It should be noted that, at step 992 of process 980, flow of liquid coolant has yet to begin as the at least one inlet of the projection of the second fastener remains concealed by an internal surface of the manifold.

At step 993 of process 980, the fastener complex, via the first fastener, can be actuated at a pre-determined torque in order to overcome the engagement force between the second fastener and the manifold and until the at least one inlet of the second fastener is exposed and liquid coolant is able to flow therethrough. Concurrently, the first fastener may be fully engaged with the LRU, translation of the first fastener being limited by contact between the head of the first fastener and a surface of the LRU, for instance. In this position, liquid coolant can flow through the at least one inlet of the second fastener, through the cavity of the second fastener to the channel of the first fastener, and into the coolant channel of the LRU via the one or more outlets of the first fastener.

With formation of a coolant coupling between the LRU and the manifold, liquid coolant can flow into the LRU and cooling can be provided to components thereof. It may become necessary, however, to replace the current LRU in view of demands of a future task or operation. Therefore, an evaluation, at step 994 of process 980, may be made to determine whether a replacement of the current LRU is necessary in view of the future task. If it is determined that the current LRU is appropriate for the future task, it is determined that no replacement is needed and the evaluation can be repeated. If, however, it is determined that the current LRU is not sufficient for the future task, the process 980 can proceed to step 995 and the current LRU can begin to be replaced.

At step 995 of process 980, the fastener complex may be actuated at a pre-determined torque and in an opposite direction such that the at least one inlet of the second fastener again becomes concealed against an internal surface of the manifold. Accordingly, flow of liquid coolant from the manifold to the LRU can be ceased.

At step 996 of process 980, the first fastener may continue to be actuated at a pre-determined torque such that a "locking" torque of the second fastener, or "locking" force that prevents the second fastener from further translation, is not overcome and the first fastener necessarily separates from the second fastener of the fastener complex. The first fastener may continue to be actuated such that, at step 997 of process 980, a head of the first fastener contacts a jacking stop feature of the LRU, for instance, and the LRU may be unmounted from the manifold. Concurrently, one or more electrical connections between the LRU and the manifold may be disconnected prior to removing the LRU from the manifold.

Having removed the LRU, a replacement LRU may be selected at step 998 of process 980, and the process 980 may return to step 991.

Figure 9:
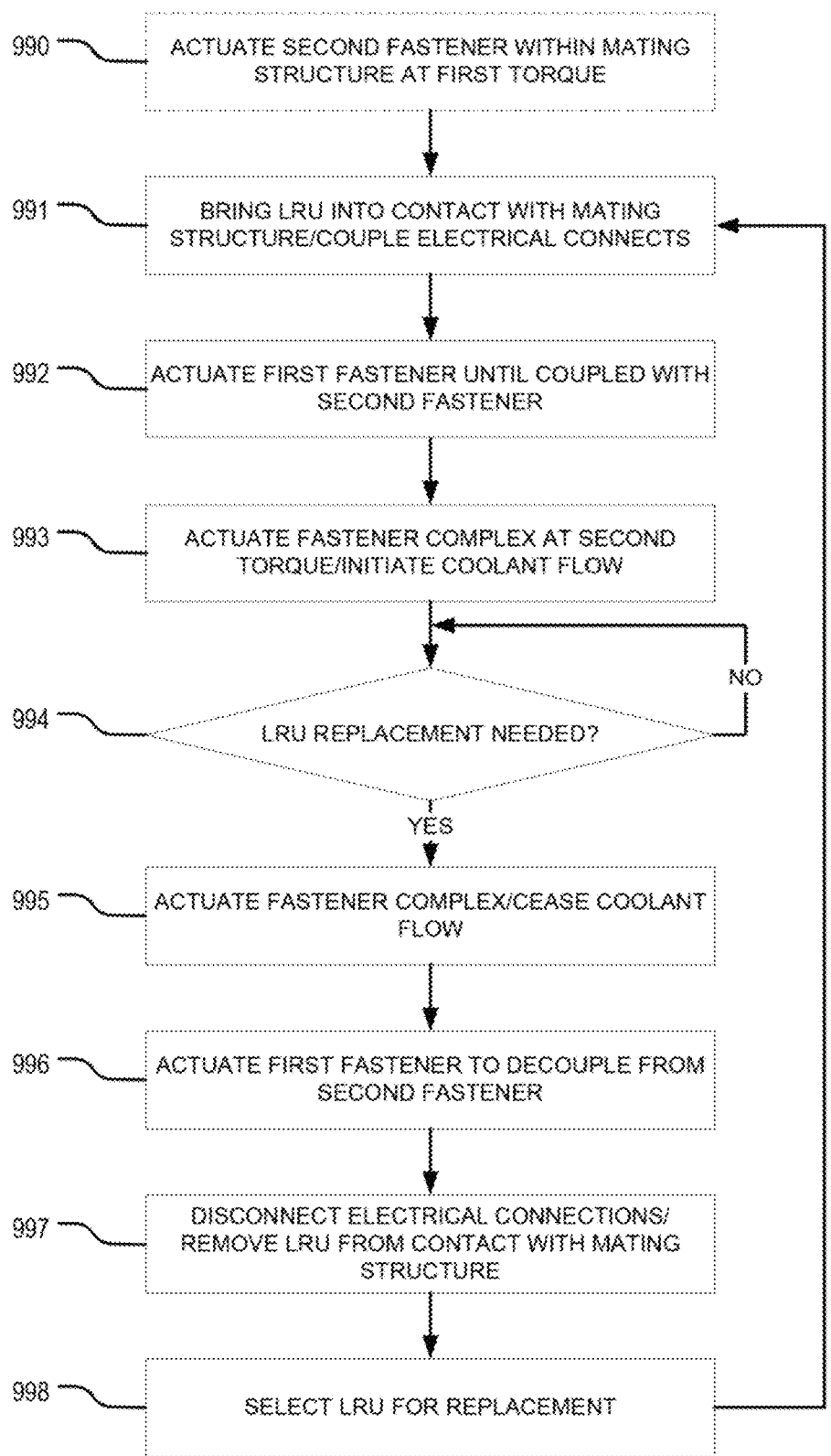
FIG. 9 is a flow chart pertaining to a mounting system, according to an exemplary embodiment of the present disclosure.
Figure 10A:
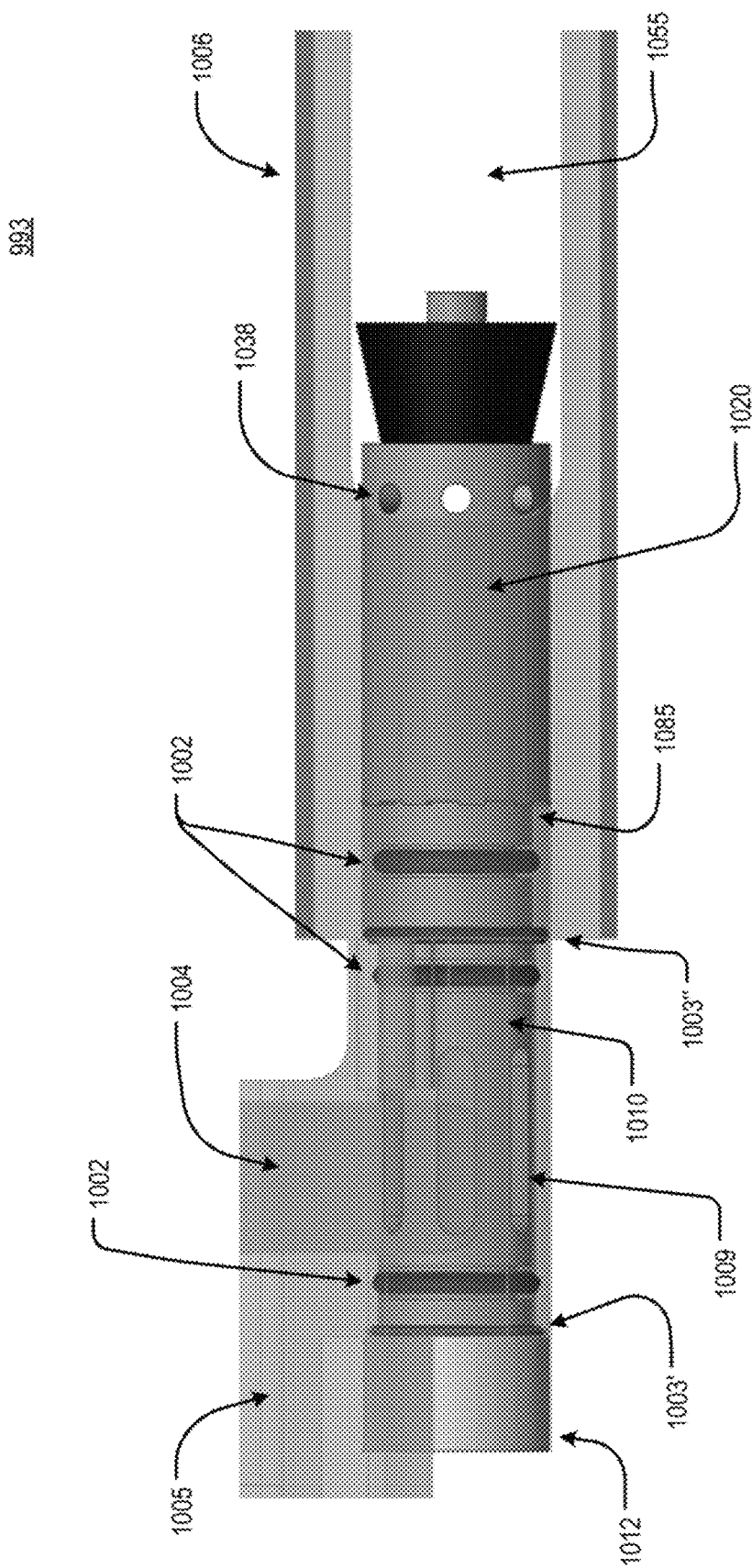
FIG. 10A is an illustration of a mounting system having a plurality of fasteners in a coupled position, according to an exemplary embodiment of the present disclosure.
Figure 10B:
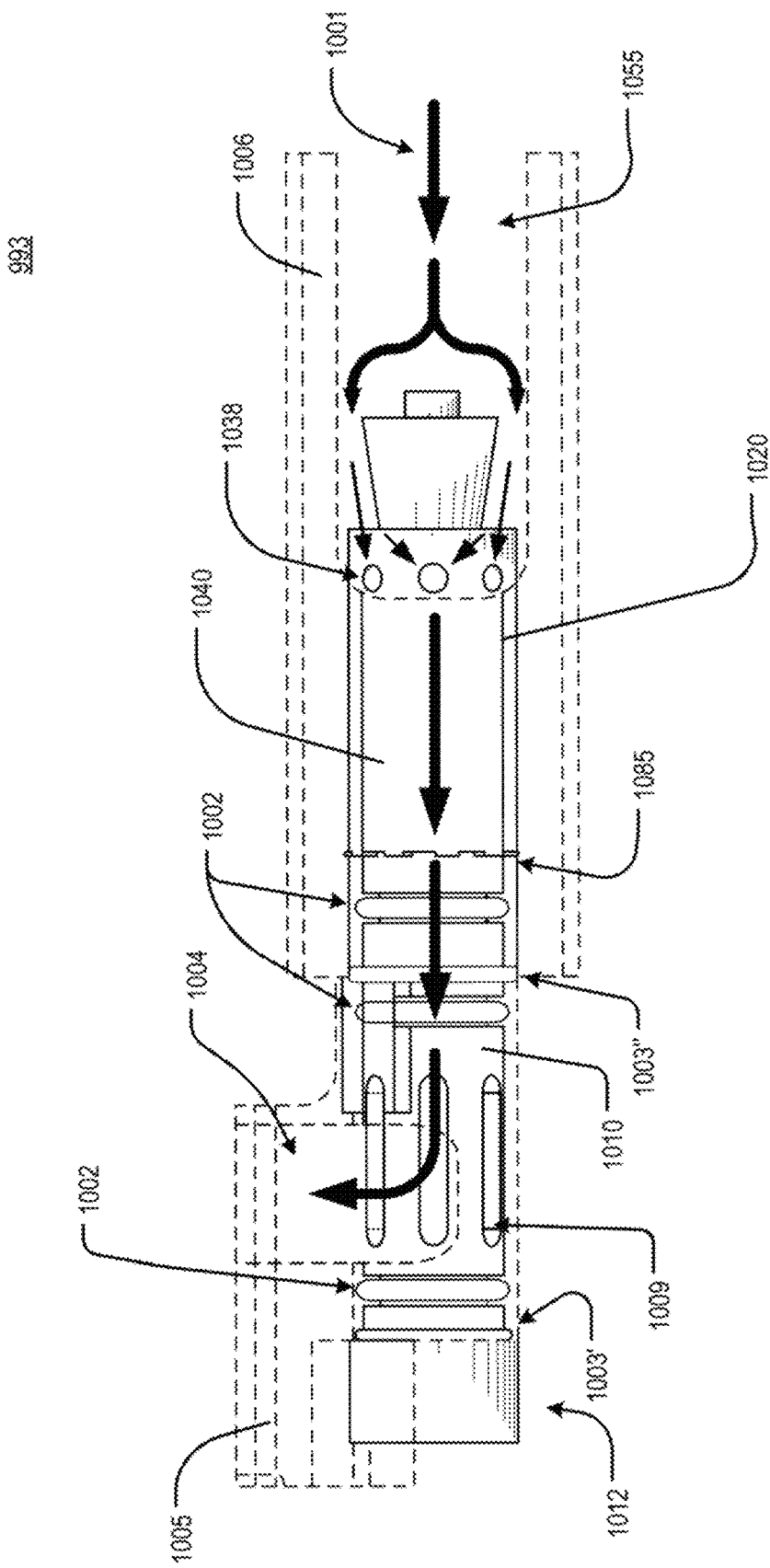
FIG. 10B is a schematic of a mounting system having a plurality of fasteners in a coupled position, according to an exemplary embodiment of the present disclosure.

FIG. 10A and FIG. 10B show views of the mounting system of FIG. 7 through FIG. 9. FIG. 10A, in particular, shows the mounting system in an active state, or mounted state of a manifold 1006 and a LRU 1005, following step 993 of process 980, wherein liquid coolant is allowed to flow from the manifold 1006 to the LRU 1005. As can be observed, at least one inlet 1038 of the second fastener 1020 can be exposed to a fluid chamber 1055 of the manifold 1006. Liquid coolant may be allowed to flow into a cavity of the second fastener 1020, across a fastener complex interface 1085, and into a channel of a first fastener 1010. The first fastener 1010, fully engaged such that a head 1012 of the first fastener 1010 is engaged with a surface of the LRU 1005, can be positioned such that one or more outlets 1009 of the first fastener 1010 are aligned with a coolant channel 1004 of the LRU 1005, the fluid connection therebetween being surrounded on either side by a plurality of radial seals 1002. During operation, the liquid coolant flowed from the manifold 1006 and into the channel of the first fastener 1010 may readily flow into the coolant channel 1004 of the LRU 1005 in order to cool internal components thereof.

FIG. 10B provides a schematic representation of the illustration of the mating system of FIG. 10A, wherein liquid coolant can be allowed to flow from manifold 1006 to LRU 1005, as described in step 993 of process 980. As can be observed, the at least one inlet 1038 of the second fastener 1020 can be exposed to fluid chamber 1055 of the manifold 1006. Liquid coolant may be allowed to flow 1001 into a cavity 1040 of the second fastener 1020, across fastener complex interface 1085, and into a channel of first fastener 1010. The first fastener 1010, fully engaged such that head 1012 of the first fastener 1010 can be engaged with a surface of the LRU 1005, a first face seal 1003' being disposed therebetween, can be positioned such that one or more outlets 1009 of the first fastener 1010 are aligned with coolant channel 1004 of the LRU 1005, the fluid connection therebetween being surrounded on either side by a plurality of radial seals 1002 and a second face seal 1003". During operation, the liquid coolant, which can flow 1001 from the manifold 1006 and into the channel of the first fastener 1010, may then readily flow 1001 into the coolant channel 1004 of the LRU 1005 in order to cool the internal components thereof.

Embodiments of the present disclosure may also be as set forth in the following parentheticals.

(1) A system for reversibly-coupling an electrical unit to a structure, comprising a fastener for the electrical unit, the fastener having a base and a projection, the projection having a proximal portion and a distal portion, the fastener being at least partially-threaded along the projection, a plurality of seals disposed radially along the projection, wherein a channel extends along a longitudinal axis of the fastener from the distal portion of the projection toward the proximal portion of the projection, one or more outlets are disposed along the projection, the one or more outlets providing fluid communication between the channel and an external environment of the fastener, and the fastener is configured to be reversibly-coupled to a mating fastener of the structure such that, when coupled, the electrical unit is rigidly coupled to the structure and fluid is able to flow therebetween.

(2) The system according to (1), wherein the one or more outlets are of a shape selected from a group including curvilinear, rectangular, and circular.

(3) The system according to either (1) or (2), wherein a subset of the plurality of seals disposed radially along the projection is positioned at opposite ends of the one or more outlets disposed along the projection.

(4) The system according to any one of (1) to (3), wherein a diameter of the base of the fastener is greater than a diameter of the projection, and a face seal sized according to a difference between the diameter of the base and the diameter of the projection is disposed on a face of the base and adjacent the projection.

(5) The system according to any one of (1) to (4), wherein the fastener includes a protrusion extending from a distal end of the distal portion of the projection, the protrusion being configured to engage the mating fastener, the mating fastener being a quick disconnect coupling.

(6) The system according to any one of (1) to (5), further comprising the mating fastener, wherein the mating fastener is generally-cylindrical, having an inner diameter and an outer diameter, the inner diameter defining a cavity and having a surface that is at least partially-threaded, and the outer diameter defining a mating external environment and having a surface that is at least partially-threaded.

(7) The system according to any one of (1) to (6), wherein at least one inlet is disposed within the mating fastener, the at least one inlet providing fluid communication between the cavity defined by the inner diameter and the mating external environment defined by the outer diameter.

(8) The system according to any one of (1) to (7), further comprising at least one seal at a proximal end of the mating fastener, wherein the at least one seal prevents axial fluid flow through the proximal end of the mating fastener.

(9) The system according to any one of (1) to (8), wherein the at least one seal comprises a fastener drive feature on an exterior surface adapted to actuate the mating fastener.

(10) A system for reversibly-coupling an electrical unit to a structure, comprising a fastener of the electrical unit, having a base and a projection, the projection having a proximal portion and a distal portion, the fastener being at least partially-threaded along the projection, a plurality of seals disposed radially along the projection, and a mating fastener having an inner diameter and an outer diameter, the inner diameter defining a cavity and having a surface that is at least partially-threaded, and the outer diameter defining a mating external environment and having a surface that is at least partially-threaded, wherein a channel extends along a longitudinal axis of the fastener from the distal portion of the projection toward the proximal portion of the projection, one or more outlets are disposed along the projection, the one or more outlets providing fluid communication between the channel and an external environment of the fastener, and the fastener is reversibly-coupled to the mating fastener such that, when coupled, the electrical unit is rigidly coupled to the structure and fluid is able to flow therebetween.

(11) The system according to (10), wherein the one or more outlets are of a shape selected from a group including curvilinear, rectangular, and circular.

(12) The system according to either (10) or (11), wherein a subset of the plurality of seals disposed radially along the projection is positioned at opposite ends of the one or more outlets disposed along the projection.

(13) The system according to any one of (10) to (12), wherein a diameter of the base of the fastener is greater than a diameter of the projection, and a face seal sized according to a difference between the diameter of the base and the diameter of the projection is disposed on a face of the base and adjacent the projection.

(14) The system according to any one of (10) to (13), wherein at least one inlet is disposed within the mating fastener, the at least one inlet providing fluid communication between the cavity defined by the inner diameter and the mating external environment defined by the outer diameter.

(15) The system according to anyone of (10) to (14), further comprising at least one seal at a proximal end of the mating fastener, wherein the at least one seal prevents axial fluid flow through the proximal end of the mating fastener, and the at least one seal comprises a fastener drive feature on an exterior surface to actuate the mating fastener.

(16) A method of reversibly-coupling an electrical unit to a structure, comprising providing, within the electrical unit, a fastener having a base and a projection, the projection having a proximal portion and a distal portion, the fastener being at least partially-threaded along the projection, providing a plurality of seals disposed radially along the projection, and providing, within the structure, a mating fastener, having an inner diameter and an outer diameter, the inner diameter defining a cavity and having a surface that is at least partially-threaded, and the outer diameter defining a mating external environment and having a surface that is at least partially-threaded, wherein a channel extends along a longitudinal axis of the fastener from the distal portion of the projection toward the proximal portion of the projection, one or more outlets are disposed along the projection, the one or more outlets providing fluid communication between the channel and an external environment of the fastener, and the fastener is reversibly-coupled to the mating fastener such that, when coupled, the electrical unit is rigidly coupled to the structure and fluid is able to flow therebetween.

(17) The method according to (16), further comprising actuating, in a first direction, the mating fastener until at least one seal at a proximal end of the mating fastener is fluidly-sealed with the structure, actuating, in a second direction opposite the first direction, the fastener until the fastener is reversibly-coupled with the at least partially-threaded surface of the inner diameter of the mating fastener, actuating, in the second direction, the reversibly-coupled fasteners until at least one inlet disposed within the mating fastener is fluidly-exposed to allow fluid flow through the mating fastener and the fastener, and actuating, in the first direction and in order to cease fluid flow between the fastener and the mating fastener, the reversibly-coupled fasteners until the fastener and the mating fastener are decoupled.

(18) The method according to either (16) or (17), wherein the at least one inlet disposed within the mating fastener provides fluid communication between the cavity defined by the inner diameter and the mating external environment defined by the outer diameter.

(19) The method according to any one of (16) to (18), wherein a subset of the plurality of seals disposed radially along the projection is positioned at opposite ends of the one or more outlets disposed along the projection.

(20) The method according to any one of (16) to (19), further comprising actuating the mating fastener using a fastener drive feature on an exterior surface of the at least one seal at the proximal end of the mating fastener.

Thus, the foregoing discussion discloses and describes merely exemplary embodiments of the present invention. As will be understood by those skilled in the art, the present invention may be embodied in other specific forms without departing from the spirit or essential characteristics thereof. Accordingly, the disclosure of the present invention is intended to be illustrative, but not limiting of the scope of the invention, as well as other claims. The disclosure, including any readily discernible variants of the teachings herein, defines, in part, the scope of the foregoing claim terminology such that no inventive subject matter is dedicated to the public.

The invention claimed is:

1. A system for reversibly-coupling an electrical unit to a structure, comprising:
   a fastener configured for coupling to the electrical unit, the fastener having a base and a projection, the projection having a proximal portion and a distal portion relative to the base, the fastener being at least partially-threaded along the projection; and
   a plurality of seals disposed radially along the projection, wherein
   a channel extends along a longitudinal axis of the fastener from the distal portion of the projection toward the proximal portion of the projection,
   one or more radial outlets are disposed along the projection, the one or more outlets providing fluid communication between the channel and an external environment of the fastener, and further wherein
   the structure includes a mating fastener and the fastener is configured to be reversibly-coupled to the mating fastener such that, when coupled, the electrical unit is rigidly coupled to the structure and fluid is able to flow between the electric unit and the structure via the mating fastener and the fastener, and further wherein
   the mating fastener includes a projection defining a cavity and having a mating external environment, an inlet disposed within the projection for providing fluid communication between the cavity and the mating external environment, and at least one seal at a proximal end of the mating fastener wherein the at least one seal prevents axial fluid flow through the proximal end of the mating fastener.

2. The system according to claim 1, wherein the one or more outlets are of a shape selected from a group including curvilinear, rectangular, and circular.

3. The system according to claim 1, wherein a subset of the plurality of seals disposed radially along the fastener projection is positioned at opposite ends of the one or more outlets disposed along the projection.

4. The system according to claim 1, wherein a diameter of the base of the fastener is greater than a diameter of the fastener projection, and a face seal sized according to a difference between the diameter of the base and the diameter of the fastener projection is disposed on a face of the base and adjacent the fastener projection.

5. The system according to claim 1, wherein the fastener includes a protrusion extending from a distal end of the distal portion of the fastener projection, the protrusion being configured to engage the mating fastener, the mating fastener being a quick disconnect coupling.

6. The system according to claim 1, further comprising the mating fastener, wherein the mating fastener is generally cylindrical, having an inner diameter and an outer diameter, the inner diameter defining the cavity and having a surface that is at least partially-threaded, and the outer diameter defining the mating external environment and having a surface that is at least partially-threaded.

7. The system according to claim 6, wherein the at least one inlet provides fluid communication between the cavity defined by the inner diameter and the mating external environment defined by the outer diameter.

8. The system according to claim 1, wherein the at least one seal comprises a fastener drive feature on an exterior surface adapted to actuate the mating fastener.

9. A system for reversibly-coupling an electrical unit to a structure, comprising:
   a fastener of the electrical unit, having a base and a projection, the projection having a proximal portion and a distal portion relative to the base, the fastener being at least partially-threaded along the projection;
   a plurality of seals disposed radially along the projection; and
   a mating fastener of the structure, the mating fastener having an inner diameter and an outer diameter, the inner diameter defining a cavity and having a surface that is at least partially-threaded, and the outer diameter defining a mating external environment and having a surface that is at least partially-threaded, wherein
   a channel extends along a longitudinal axis of the fastener from the distal portion of the projection toward the proximal portion of the projection,
   one or more outlets are disposed along the projection, the one or more outlets positioned radially outward from the longitudinal axis and providing fluid communication between the channel and an external environment of the fastener,
   the fastener is reversibly-coupled to the mating fastener such that, when coupled, the electrical unit is rigidly coupled to the structure and fluid is able to flow between the electric unit and the structure via the mating fastener and the fastener,
   at least one inlet disposed within the mating fastener for providing fluid communication between the cavity and the mating external environment, and
   at least one seal at a proximal end of the mating fastener for preventing axial fluid flow through the proximal end.

10. The system according to claim 9, wherein the one or more outlets are of a shape selected from a group including curvilinear, rectangular, and circular.

11. The system according to claim 9, wherein a subset of the plurality of seals disposed radially along the projection is positioned at opposite ends of the one or more outlets disposed along the projection.

12. The system according to claim 9, wherein a diameter of the base of the fastener is greater than a diameter of the projection, and a face seal sized according to a difference between the diameter of the base and the diameter of the projection is disposed on a face of the base and adjacent the projection.

13. The system according to claim 9, wherein the at least one seal comprises a fastener drive feature on an exterior surface to actuate the mating fastener.

14. A method of reversibly-coupling an electrical unit to a structure, comprising:
providing, within the electrical unit, a fastener having a base and a projection, the projection having a proximal portion and a distal portion relative to the base, the fastener being at least partially-threaded along the projection;
providing a plurality of seals disposed radially along the projection; and
providing, within the structure, a mating fastener, having an inner diameter defining a cavity and having a surface that is at least partially-threaded, an outer diameter defining a mating external environment and having a surface that is at least partially-threaded, and at least one seal at a proximal end of the mating fastener for fluidly sealing the proximal end, wherein
a channel extends along a longitudinal axis of the fastener from the distal portion of the projection toward the proximal portion of the projection,
one or more radial outlets are disposed along the projection, the one or more outlets providing fluid communication between the channel and an external environment of the fastener, and
the fastener is reversibly-coupled to the mating fastener such that, when coupled, the electrical unit is rigidly coupled to the structure and fluid is able to flow between the electric unit and the structure via the mating fastener and the fastener.

15. The method according to claim 14, further comprising:
actuating, in a first direction, the mating fastener until the at least one seal at the proximal end of the mating fastener is fluidly-sealed with the structure;
actuating, in a second direction opposite the first direction, the fastener until the fastener is reversibly-coupled with the at least partially-threaded surface of the inner diameter of the mating fastener;
actuating, in the second direction; the reversibly-coupled fasteners until at least one inlet disposed within the mating fastener is fluidly-exposed to allow fluid flow through the mating fastener and the fastener; and
actuating, in the first direction, and in order to cease fluid flow between the fastener and the mating fastener, the reversibly-coupled fasteners until the fastener and the mating fastener are decoupled.

16. The method according to claim 15, wherein the at least one inlet disposed within the mating fastener provides fluid communication between the cavity defined by the inner diameter and the mating external environment defined by the outer diameter.

17. The method according to claim 14, wherein a subset of the plurality of seals disposed radially along the projection is positioned at opposite ends of the one or more outlets disposed along the projection.

18. The method according to claim 15, further comprising actuating the mating fastener using a fastener drive feature on an exterior surface of the at least one seal at the proximal end of the mating fastener.

* * * * *